(12) United States Patent
Miyahara (10) Patent No.: US 6,571,595 B2
(45) Date of Patent: Jun. 3, 2003

(54) METHOD OF FORMING A PACKAGE FOR ELECTRONIC PARTS

(75) Inventor: Hideyuki Miyahara, Nagano (JP)

(73) Assignee: Nakamura Seisakusho Kabushikigaisha, Okaya (JP)

( * ) Notice: Subject to any disclaimer, the term of this patent is extended or adjusted under 35 U.S.C. 154(b) by 0 days.

(21) Appl. No.: 09/907,604

(22) Filed: Jul. 18, 2001

(65) Prior Publication Data

US 2002/0043090 A1 Apr. 18, 2002

(30) Foreign Application Priority Data

Jul. 21, 2000 (JP) ........................................ 2000-221468

(51) Int. Cl.$^7$ ............................................. B21D 28/02
(52) U.S. Cl. .............................. 72/332; 72/324; 72/340
(58) Field of Search .......................... 72/341, 340, 334, 72/324, 327, 379.2, 332; 29/896.6

(56) References Cited

U.S. PATENT DOCUMENTS

| | | | | |
|---|---|---|---|---|
| 3,566,513 A | * | 3/1971 | Fuller | ........................ 29/896.6 |
| 5,105,586 A | * | 4/1992 | Jenne et al. | ................. 451/540 |
| 5,502,994 A | * | 4/1996 | Katoh et al. | ................... 72/327 |
| 5,920,981 A | * | 7/1999 | Bushelle et al. | ............... 72/340 |
| 5,989,107 A | * | 11/1999 | Shimizu et al. | .............. 451/285 |
| 6,145,365 A | | 11/2000 | Miyahara | |
| 6,155,093 A | * | 12/2000 | Lipari | .......................... 72/341 |

* cited by examiner

Primary Examiner—Daniel C. Crane
(74) Attorney, Agent, or Firm—Flynn, Thiel, Boutell & Tanis, P.C.

(57) ABSTRACT

A package for receiving electronic parts is formed with decreased stress and stress concentration to obtain a desired warp and flatness. In particular, according to a cutting protruding part process, a package is accommodated to have a recessed part formed on one face of a metal plate by pressing the face of the metal plate so that a corresponding protruding part is formed bulging from an opposing face of the metal plate. The protruding part is cut by a cutting tool and a bottom which has a cavity shape and is thinner in size than the metal plate is formed at the recessed part. The protruding part is again formed bulging from the metal plate and cut by the cutting tool. The cutting direction is differed in alternately facing directions so that the stress from cutting is almost cancelled.

17 Claims, 8 Drawing Sheets

METHOD OF FORMING A PACKAGE FOR ELECTRONIC PARTS

BACKGROUND OF THE INVENTION

1. Field of the Invention

The present invention relates to a cavity shaped package having a recessed portion for accommodating electronic parts such as an integrated circuit, hybrid circuits and so on, in particular, a method of forming a package for electronic parts which is made from a metal plate.

2. Description of Related Art

Through the progress of information devices such as personal computers and so on in recent years, electronic parts such as semiconductor IC circuits or hybrid circuits have been advanced into higher density and higher processing speed, and the information devices using these electronic parts are becoming more precise and more miniaturized. On the other hands, higher density and higher processing speed of these electronic parts increases the amount of heat generated therein. Thus, heat sink means having high efficiency of heat radiation is required. However, the problem is that such miniaturized devices incorporating electronic parts cannot secure enough space for heat sink means that have necessary efficiency of heat radiation due to the miniaturization thereof.

Figure 7:
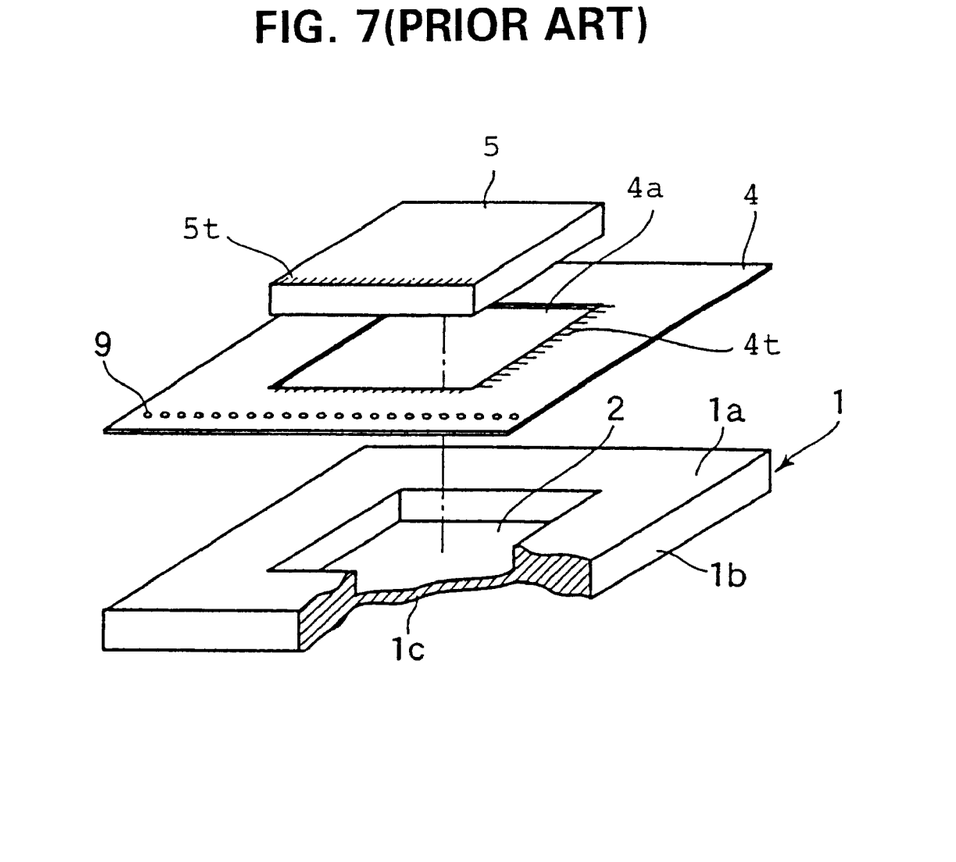
FIG. 7 is an exploded perspective view of a package for electronic parts according to the present invention.
Figure 8:
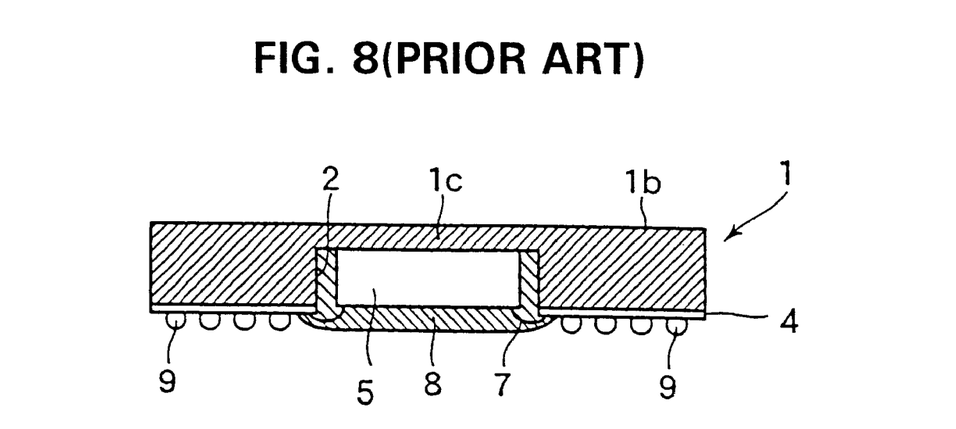
FIG. 8 is a cross-sectional view of the package indicated in FIG. 7.

In order to solve the problem, a cavity type package comprising a metal plate called "stiffener", which has a window or a recess at the center for accommodating electronic parts, has been occurred. The package allows the amount of heat generated from the electronic parts to be evacuated by the metal plate of the stiffener. Such package has in one body both functions as a heat spreader and as a stiffener for reinforcing the package. The package made from a metal plate will be an alternative to a conventional package, for example, made from ceramics since the former is superior to the latter in the heat sink function, FIGS. 7 and 8 show a package of a semiconductor IC circuit as an example applying abovementioned package. The raw materials of the package 1 is selected from one of metal materials, which has a high thermal conductivity required as a heat spreader and for which plastically deforming processing is applicable, such as cupper alloy stainless steel, aluminum and so on.

An approximately rectangular recess portion 2 having a bottom portion 1c with a predetermined thickness is formed at the center of the surface on one side 1a of the package 1. That is, this package 1 is formed in a cavity shape as a whole. A wiring board 4, which is a TAB or flexible printed board, a usual pointed board, etc., is stuck and secured to the one side 1a of the package 1 by means of an adhesive. The wiring board 4 may be a layer on which a wiring circuit is formed and by which the wiring circuit is insulated from the package 1. An opening 4a having an approximately same size as the recess portion 2 is formed in this wiring board 4. A terminal portion 4t having a number of terminals is formed by printed wiring on the periphery of this opening 4a with a wire width and a pitch of about 37 nm. The terminals of the terminal portion 4t are electrically connected by printed wiring to externally connecting terminals (not indicated in the figures), which are formed on an outer periphery of the wiring board 4.

Further a chip 5 of electronic parts such as a semiconductor integrated circuit is accommodated in the recess portion 2 formed on the one side 1a of the package 1. The chip 5 is stuck to the bottom portion 1c of the recess portion 2 by means of an adhesive in a state where a surface of the chip 5 and that of the bottom portion 1c are tightly fitted. What is important in this sticking using an adhesive is that no bubbles should be produced between the chip 5 and the bottom portion 1c of the recess portion 2. This is because the bubbles are expanded and the chip 5 may be thereby peeled off in case where heat is produced during working of the electronic parts in the chip 5 and in case where heat is subjected to the package 1 during its assembling to an apparatus. Thus, the bottom portion 1c of the recess portion 2 should be formed in such an evenness that warp is smaller than 30 nm.

On the upper surface of the chip 5 there are disposed a number of terminals 5t with a same wire width and a same pitch as those in the terminal portion 4t formed on the wiring board 4. Each of the terminals 5t of the chip 5 and each terminal of the terminal portion 4t of the wiring board 4 are electrically connected by bonding wires 7, as indicated in FIG. 7. Further sealing agent 8 is injected into the recess portion 2 of the package 1 to seal the chip 5 and the bonding wires 7.

When the electronic parts such as an integrated circuit packed in the package 1 as described above is mounted onto a circuit board of an electronic apparatus not indicated in the figure, solder balls 9 are placed on the externally connecting terminals formed on an outer periphery of the wiring board 4 and they are melted by heating in a state where the package 1 is provisionary fixed at predetermined position on the circuit board of the electronic apparatus. In this way the electronic parts packed in the package 1 and the circuit board of the electronic apparatus are connected electrically via the wiring board 4 without any damages to the package 1 and its electronic parts due to expanding the bubbles between the chip 5 and the bottom portion 1c.

On the other hand, when a semiconductor IC circuit is exothermic in operating, the package 1 itself has a function of heat spreader, thereby, heat is conducted the package 1 and is released.

In a forming method of above constituted cavity type package, for example, there is a method that a concave part is pressing processed using a pressing punch by press machine or by chemically etching process, a concave part is formed in a metal plate so that keep a bottom of a thin plate.

However, in a pressing process by press machine metal part of volume of the recess part is pushed into a bottom part and periphery. The periphery metal part is curled, then the flatness of the part is not able to correct state. Thereby, a package acquired necessity flatness has a fatal problem. The chemically etching process takes long time, so there are troublesome that the method is not suited in mass production and takes more cost in necessity. Moreover, precision by limiting to control etching process is worth, there is troublesome that practical use has a limit.

Inventors have proposed in U.S. Pat. No. 6,145,365 a preferred method for forming above mentioned type package made from a metal plate. FIGS. 9(A) to 9(D) shows the proposed method in summary. The method will be described herein below.

Figures 9A, 9B:
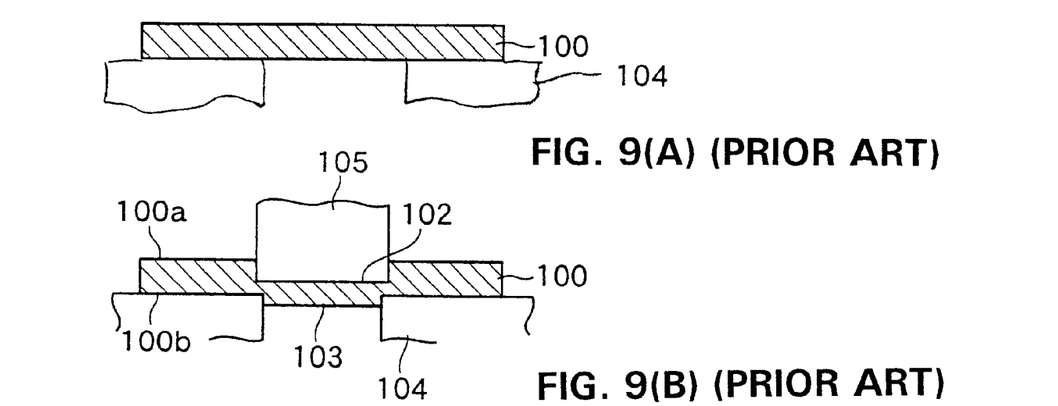

FIG. 9(A) shows a metal plate 100 that is positioned with respect to a die 104 of a press machine. FIG. 9(B) shows a pressing process, where the metal plate 100 is pressed recessed by a punch 105 of the press machine onto one side surface 100a so that the recessed part 102 is formed. At the same time, a protruding part 103 is formed in ledge shape on another side surface 100b of the metal plate 100.

Figure 9C:
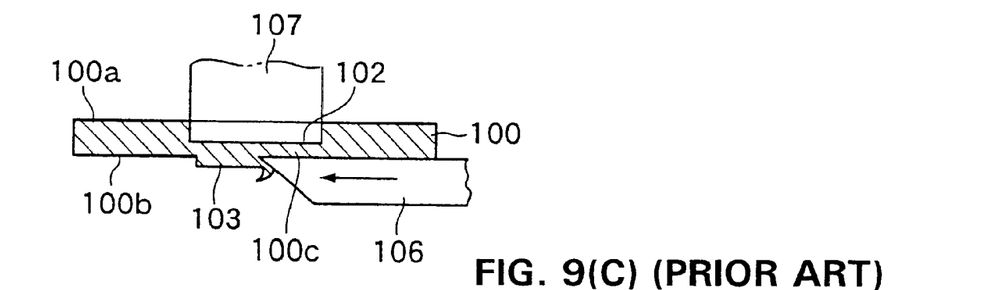
Figure 9D:
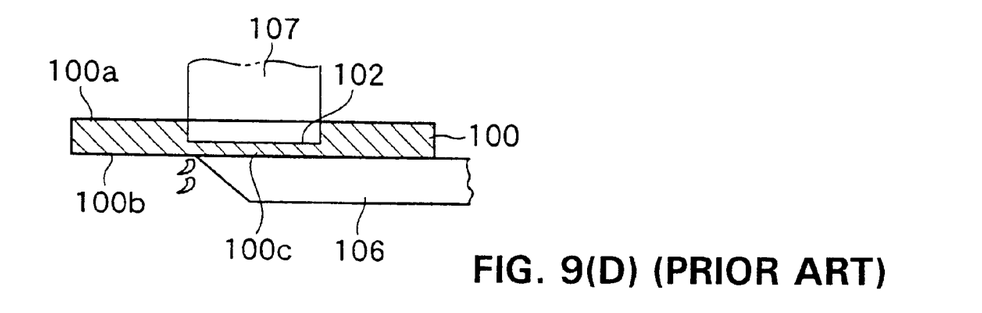

FIGS. 9(C) and 9(D) show cutting process, wherein a cutter 106 shaves off the protruding part 103 formed on the surface 100b so as to form a thin bottom 100c and to make the surface 100b flat. In this cutting process, to avoid displacement of the bottom plate 100c in the direction to the recessed part 102, the bottom plate 100c is pressively supported by a supporting tool 107. According to the above-mentioned processes, the recessed part 102 for accommodating a chip of electronic parts is formed in the metal plate 100, which has a bottom plate 100c having a predetermined comparatively thin thickness as the bottom of the recessed part 102. Thereby, the recessed part 102 of predetermined depth is formed by pressing and cutting without any damages to the bottom plate 100c.

In the above methods, it is possible to form the recessed part 102 having a predetermined shape only on one side of the metal plate without giving the metal plate any remarkable stress or changing the composition of the metal plate because metal corresponding to the recessed part 102 is displaced to the protruding part 103 on the other side of the metal plate by plastically deforming processing by means of the press. However, in the cutting process, it is inevitable that the cutter 106 pulls the metal of the protruding part 103 around the cutting line by its movement. Therefore, the metal plate suffers a stress, especially at and around the bottom part 100c.

Further, into the portion where the cutting by the cutter 106 ends, shown in left side on FIG. 9(D), a stress of pressure by the movement of the cutter 106 is concentrated. Such stresses provided by cutting process of the protruding part 103 lead to the problems that the dimensions of the package may change over time and that a time-varying warp may occur. Thereby, as mentioned above, in a package of electronic parts that requires such evenness that warp within 30 nm, the time-varying changes of dimensions and evenness become a fatal defect.

SUMMARY OF THE INVENTION

In order to solve such problems, the present invention, a package for accommodating in a recessed part formed one face of a metal plate, in package forming method for electronic parts formed cavity shaped which has thinner bottom part than the metal plate characterized in that, the package is formed the recessed part by pressing press machine or the like from one face of the metal plate and protruding part formed bulgingly in another face of the metal plate, by forming of the recessed part is cut by cutting tool dividedly in more than one and a cutting direction is differed in alternately facing to each other, so stress by cutting is almost cancelled.

Moreover, in the present invention, pressing process for pressing recessed part from one face of the metal plate and cutting process for cutting protruding part of another face of the metal plate are performed repeatedly more than one, and forming in stepwise desired depth of recessed and protruding parts in every forming frequencies a cutting direction may be differed in alternately facing to each other.

Moreover, in the present invention, pressing recessed part of predetermined depth in a face of the metal plate, protruding part of another face (opposite site face) of the metal plate is formed, in every cutting the protruding part dividedly in stepwise, a cutting direction may be differed in alternately facing to each other.

Moreover, in the present invention, when protruding part of another face of the metal plate is formed in every cutting the protruding part dividedly in stepwise, number of times of a cutting direction in alternately facing to each other may be the same.

Furthermore, in the present invention, predetermined recessed part which is shallower than thickness size of the metal plate from a face of the metal plate and the protruding part which is a little small than the recessed part in another face of the metal plate may be formed in every cutting the protruding part dividedly in stepwise, a cutting direction may be differed in alternately facing to each other.

BRIEF DESCRIPTION OF THE DRAWINGS

FIGS. 1(A) to 1(G) are diagrams for explaining a processing procedure of an embodiment of the package forming method according to the present invention;

FIGS. 9(A) to 9(D) are diagrams for explaining a processing procedure of the former method for forming a package proposed by the inventor.

DESCRIPTION OF THE PREFERRED EMBODIMENTS

Hereinafter the method for forming a package for electronic parts made of a metal plate according to the present invention will be explained in detail, based on a mode of realization indicated in drawings.

Figure 1A:
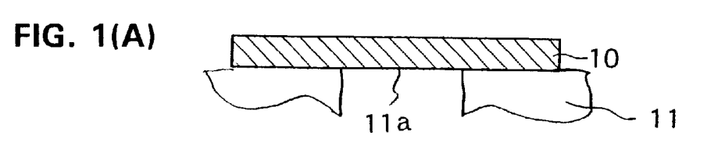

FIGS. 1(A) to 1(G) shows the first embodiment. FIG. 1(A) shows metal plate 10 that forms the package 1 shown in FIG. 7. The metal plate 10 is positioned with respect to a die 11 of a press that has a recess 11a at a predetermined portion. The raw material for the metal plate 10 is selected from one of cupper alloy, stainless steel and aluminum or the like. As the metal plate 10, both a sheet cut into a predetermined size and a rolled band like material can be used.

Figure 1B:
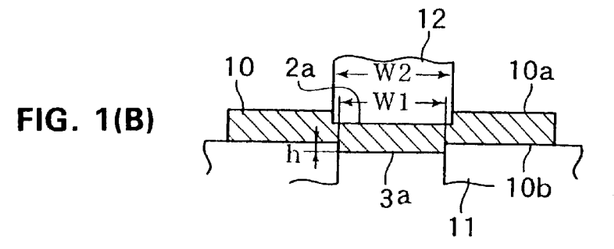

FIG. 1(B) shows a step of the first pressing processing. After the metal plate 10 is positioned on die 11, a preliminary recess portion 2a that is shallower than the recess portion 2 is formed on one side 10a of the metal plate 10 by means of a punch 12 of the press. An edge of the punch 12 is formed nearly square form in a predetermined size.

Figure 1C:
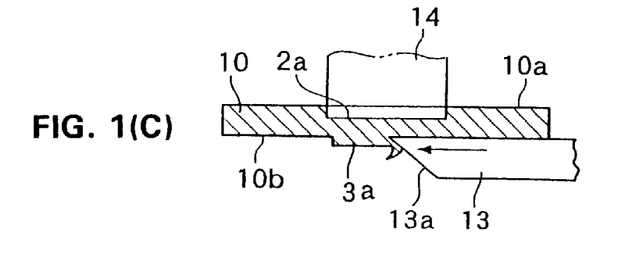
Figure 2A:
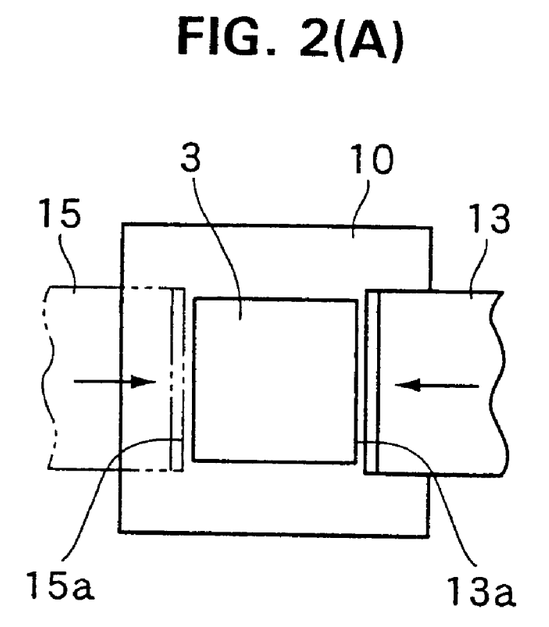
FIGS. 2(A) and 2(B) are plan views showing examples of the cutters and the cutting processing by them according to the present invention.
Figure 2B:
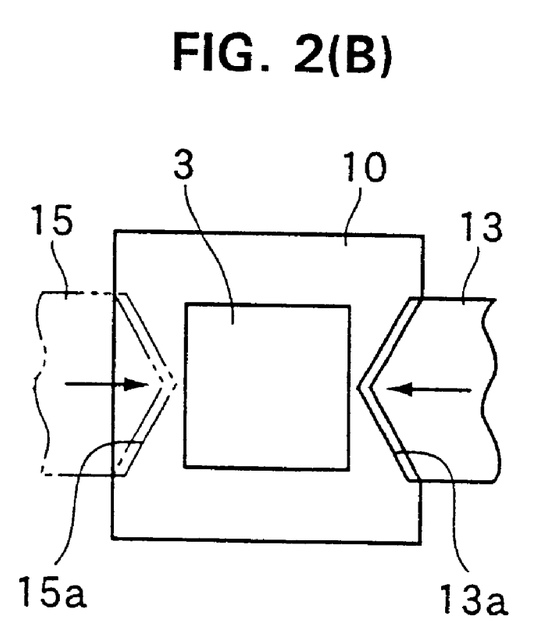

At the time of forming the preliminary recess portion 2a, an amount of metal corresponding to the preliminary recess portion 2a is displaced to the other side 10b by the pressure added by the punch 12. As the result, a protruding portion 3a protruding from the surface on the other side 10b of the metal plate 10 is formed so as to have a height h approximately equal to the depth of the preliminary recess portion 2a. The outer perimeter W1 of the protruding portion 3a is slightly smaller in size than the outer perimeter W2 of the preliminary recess portion 2a. Also the protruding portion 3a is analogous in shape to and centered under the preliminary recess portion 2a. Since such a relation in size is set, the protruding portion 3a is not cut-off from the metal plate 10 at its edge portion so that it can be always kept joined thereto and that a stress at the cutting processing described later can be minimized. Further, it is desirable to set the height h of the protruding portion 3a at such a value that it can be shaved off with the minimum stress at the cutting processing. FIGS. 1(C) and 2(D) show a first cutting processing, in which the protruding portion 3a formed on the other side 10b of the metal plate 10 by the first pressing process is shaved off at its root by means of a cutter 13 so that the cut surface newly obtained by the shaving is coplanar with the other part of the surface of the other side 10b. The cutter 13 used for the cutting processing has a blade 13a. As the shape of the blade 13a, both a straight lined blade whose extremity is straight line as indicated in FIG. 2(A) and an arrow-shaped blade whose extremity is pointed at the center as indicated in FIG. 2(B) are acceptable. But the arrow-shaped blade is more preferable than the straight lined blade in order to minimize the stress during the cutting processing. Moreover, the blade 13a of the cutter 13 is desirable to have a gradient type extremity that is sharp-pointed into the direction of its movement.

Figure 1D:
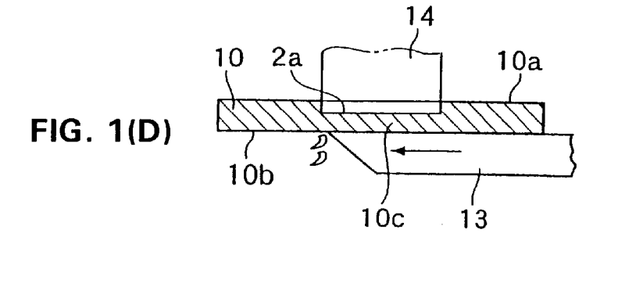

The cutter 13 is advanced in the direction indicated by an arrow in FIG. 1(C), that is to say, form the front end to the rear end. As indicated in FIG. 1(D), the first cutting processing terminates when the extremity of the blade 13a has reached to the rear end of the protruding portion 3a. In this cutting processing it is desirable that a supporting tool 14 which support the bottom of the preliminary recess portion 2a under pressure is inserted therein in order to prevent the bottom from being displaced inwardly by the cutter 13. When the cutter 13 cuts the protruding part 3, the portion of the metal plate 10 where the cutting is executed suffers stress due to concentration of pressure by advancing movement of the cuter 13 toward the rear end and due to tensions pulled by the cutter 13 in the cut surface. Though these kinds of the stresses vary by difference among tenacity of the metal materials, these stresses are dissolved in the second cutting processing described later.

Figure 1E:
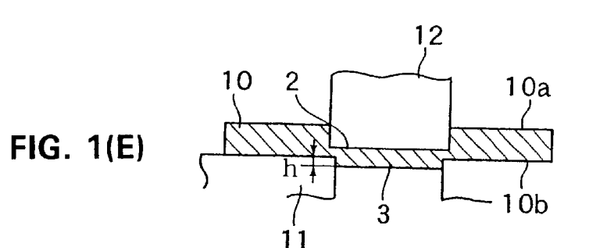

Next FIG. 1(E) shows a step of the second pressing processing. The second pressing processing is executed by means of the punch 12 and the die 11 of the press so as to make the preliminary recess portion 2a formed by the first pressing processing deeper, and to form the recess portion 2 having the final depth and shape required as the package 1. At the same time, a protruding portion 3 whose height is approximately equal to the increased depth of the recess portion, is formed on the other side 10b of the metal plate 10, similarly to the first pressing processing. The outer size of this protruding portion 3 is slightly smaller than the inner size of the recess portion 2 and the protruding portion 3 is analogous to the recess portion 2.

Figure 1F:
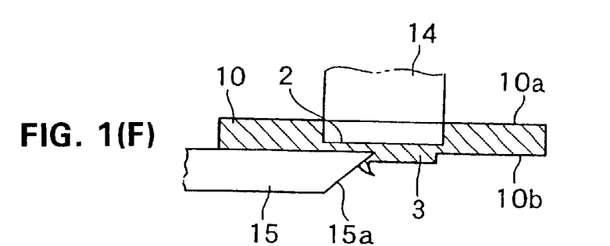
Figure 1G:
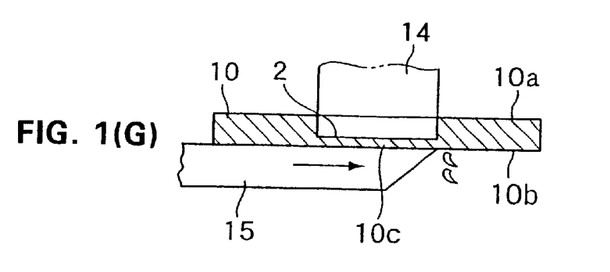

Then a second cutting processing indicated in FIGS. 1(F) and 1(G) are executed. The protruding portion 3 formed on the other side 10b of the metal plate 10 by the second pressing processing is shaved off at its root by means of the cutter 15 so that the cut surface newly obtained by the shaving is coplanar with the remaining part of the surface of the other side 10b. As indicated by an arrow in FIGS. 1(F) and 1(G), the direction that the cutter 15 advances is reversed to that the cutter 13 has advanced though the second cutting processing is similar to the first cutting processing and the cutter 13 used at this second processing is the same as that has used in the first cutting processing. When the cutter 15 has advanced in the inverse direction with respect to that of the cutter 13, and has reached at the position indicated in FIG. 1(G), the surface of the other side 10b of the metal plate 10 is formed flat and a thin bottom plate 10c is formed in the bottom of the recess portion 2.

As a result of the second cutting processing, the concentration of stress and stress itself generated in the metal plate 10 at the first cutting processing are almost cancelled or reduced sharply because of the inverse advancing of the cutter 15 with respect to the direction that the cutter 13 has advanced. Also, in the second cutting process, it is desirable that a supporting tool 14 is inserted into the recess portion 3 in order to support the thin bottom plate 10c under pressure and to prevent the bottom plate 10c from being displaced inwardly by the cutter 15.

The cutter 15 used in the second cutting processing is formed as same as the cutter 13 used in the first cutting processing so as to achieve the first and second cutting processing under the same cutting conditions. The cutting condition is so set that the concentration of stress and stress itself may be cancelled. It is another example to accomplish the same cutting condition between the first and second cutting processing that the metal plate 10 is turned horizontally in an inverse direction at each of the first and second cutting processing in order to cut the protruding portions alternately into a regular direction and a counter direction while using one of the cutter 13 and 15, which moves in one way.

In general, the required flatness for the bottom plate 10c of the package 1 is warp within 30 nm or less and the required flatness for the package 1 as a whole is warp within 70 nm or less. According to the steps described above, the required flatness of the package 1 can be obtained by canceling the concentration of stress and irregular deformation of the bottom plate 10c. Moreover the package 1 can be prevented from changes with the passage of time due to small range of the concentration of stress and irregular deformation.

Another Embodiment

Figure 3A:
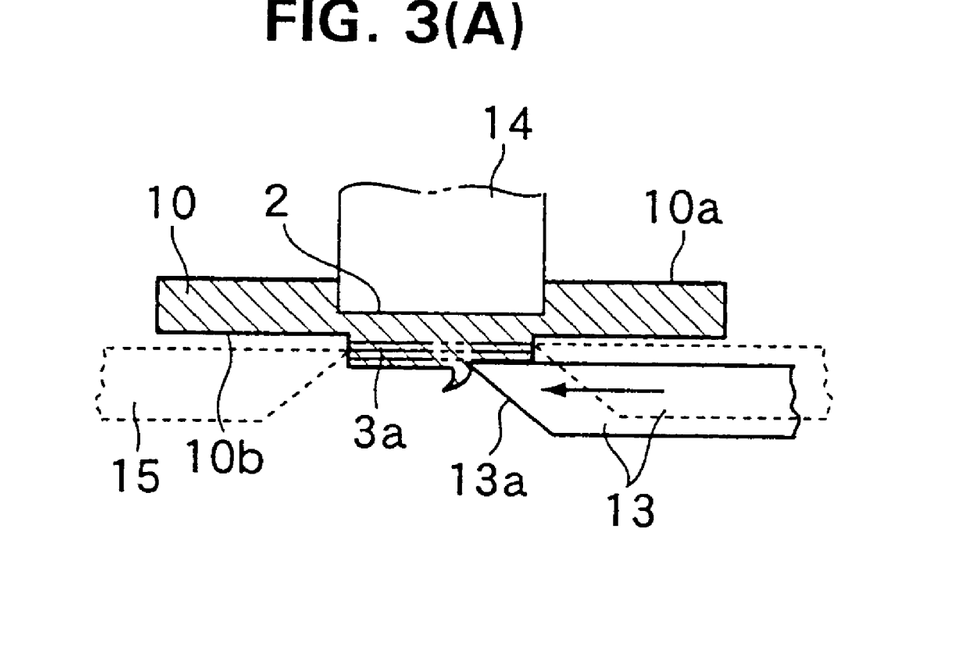
FIGS. 3(A) and 3(B) are diagrams for explaining a processing procedure of another example of cutting the protruding portion in the steps for forming the package according to the present invention.
Figure 3B:
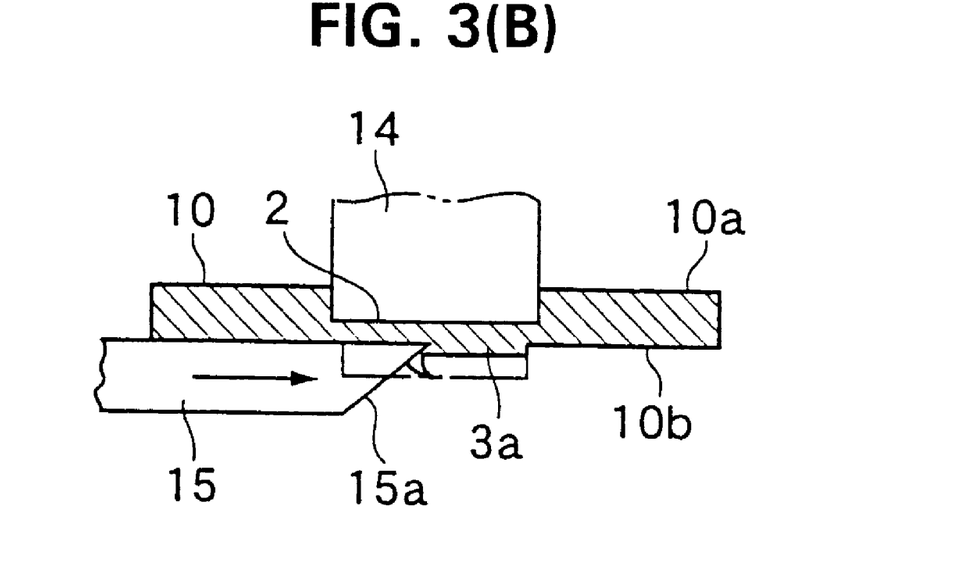

FIGS. 3(A) and (B) show another embodiment of the method for forming a package 1, in which both the recess portion 2 having a predetermined depth as the package 1 in one side surface 10a and the protruding portion 3b protruding onto the other side surface 10b are formed by one pressing processing. Thereafter the protruding portion 3b is cut bit by bit repeatedly in a plurality of times. That is as shown in FIG. 3(A), a first cutting processing is executed in such a way that a part of the thickness of the protruding portion 3b along a slice line is shaved off by the cutter 13 advancing from right to left in regular direction. Next, a second cutting processing is executed in such a way that the next part of the thickness of the protruding portion 3b along the next slice line is shaved off by the cutter 15 advancing form left to right in the counter direction. Then, the cutter 13 executes a third cutting processing in the same way as the first cutting processing and the cutter 15 executes a forth cutting processing in the same way as the second cutting processing.

The cutting processing by the cutter 13 and 15 is executed alternately until the remaining part of the protruding portion 3b is shaved off at its root and the cut surface newly obtained by the cutting becomes coplanar with remaining part of the surface of the other side 10b. In this way, since the cutting processing is repeated in a plurality of times changing the advancing directions of the cutters alternately in regular direction and in counter direction, the concentration of stress and irregular deformation of the bottom plate 10c caused by the cutter 13 can be canceled or reduced significantly by the movement of the cutter, and vice versa. Further, since the thickness of the protruding portion 3b shaved off by one cutting processing sets so small that the infliction of remaining stress and direct stress on the metal plate 10 is prevented and it remains as is, similarly to the example described referring to FIGS. 1(A) to 1(G).

As described above, it is preferable that the each number of times of cutting in regular direction and in counter direction finally becomes same when protruding 3b formed on the surface of the other side 10b is cut bit by bit in several times. In the example shown in FIG. 3, each number of times in regular direction and in counter direction is two times each but it can be set selectively as desired according to the thickness of a part of the protruding portion 3b cut in one time. As so set, the concentration of stress and irregular deformation of the package 1 caused by each cutting processing can be canceled by each next cutting processing in the reverse direction.

Figure 4A:
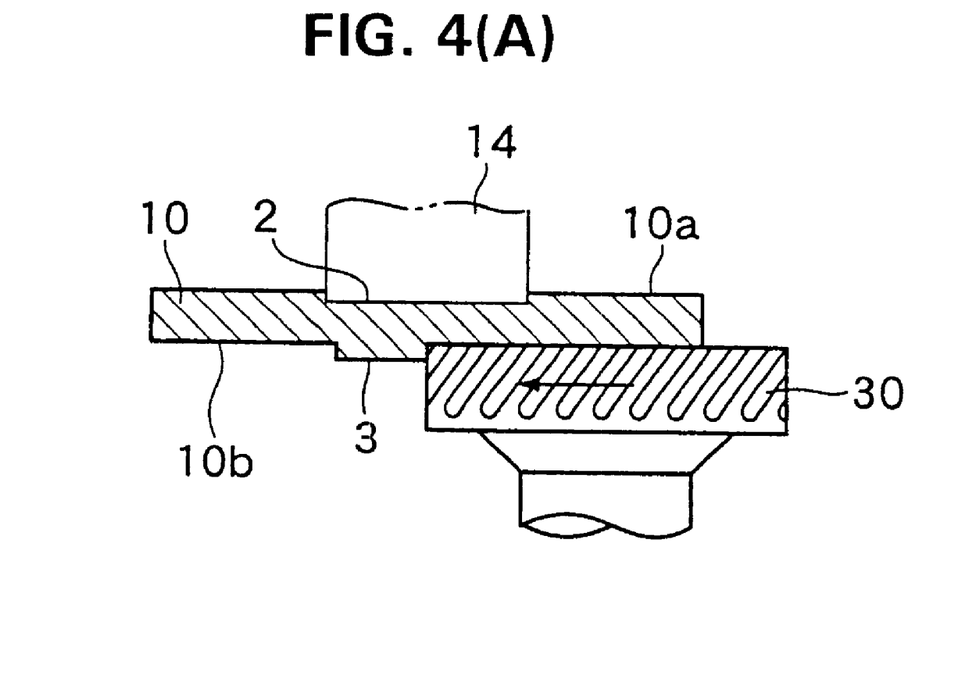
FIGS. 4(A) and 4(B) are diagrams for explaining a processing procedure of another example of cutting the protruding portion by a rotating cutter in the steps for forming the package according to the present invention.
Figure 4B:
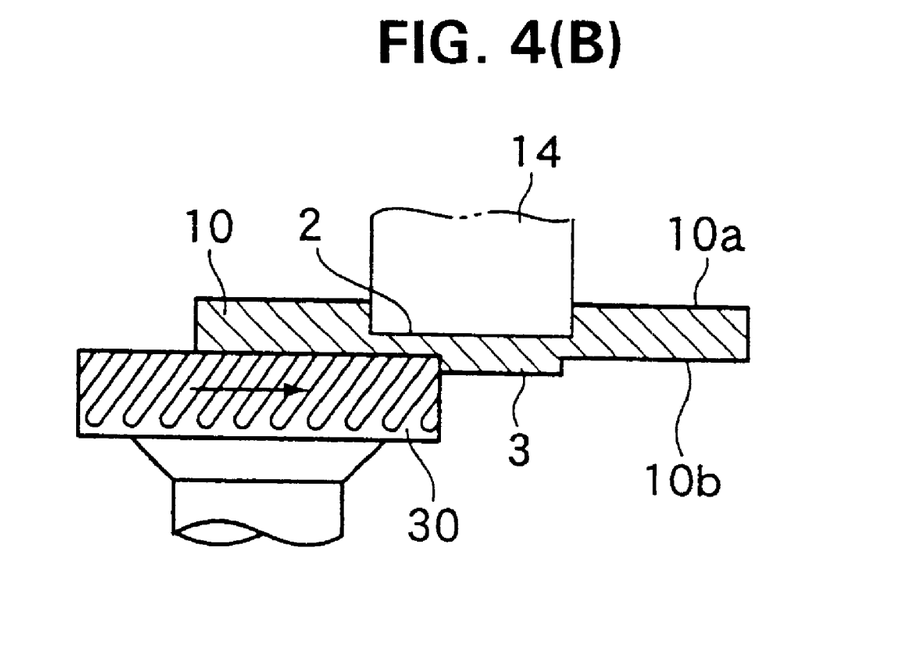

FIGS. 4(A) and 4(B) show another example of the method in which rotating blades 30 of a milling machine is used as cutting tool instead of the cutter used in the first and second cutting processing shown in aforesaid FIGS. 1(C) and 1(F). That is, as shown in FIG. 4(A), after the first pressing processing, the first cutting processing is executed in such way that that the rotating blades 30 cut the protruding part 3a advancing from right to left in regular direction so that the cut surface newly obtained by the cutting is coplanar with the remaining part of the surface of the other side 10b. Then, as shown in FIG. 4(B), in the second cutting processing after the second pressing processing the rotating blades 30 cut the protruding part 3 moving right to left in the counter direction so that the cut surface newly obtained by the cutting becomes coplanar with the remaining part of the surface of the other side 10b.

Though the method by the rotating blades of a milling machine affects less stress than that by aforementioned cutter 13 or 15, there causes and remains still some concentration of the stress. But, since the cutting processing is executed in such a way that the rotating blades of a milling machine moves in a plurality of times alternately in regular direction and in counter direction, the concentration of stress and irregular deformation of the bottom plate 10c caused by the rotating blades can be canceled or reduced significantly.

Figure 5A:
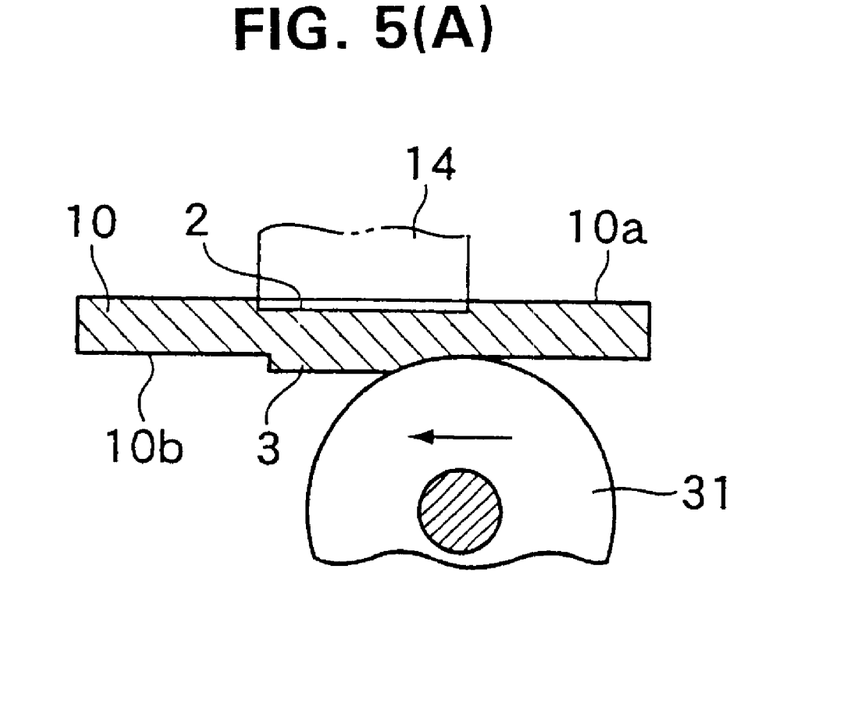
FIGS. 5(A) and 5(B) are diagrams for explaining a processing procedure of another example of cutting the protruding portion by a grinder in the steps for forming the package according to the present invention.
Figure 5B:
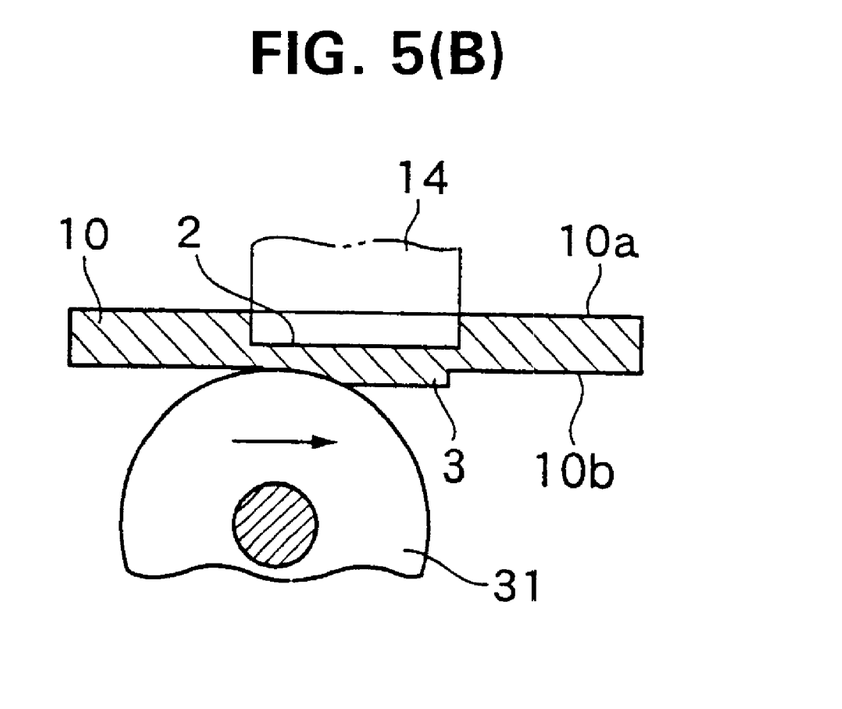

FIGS. 5(A) and 5(B) show modified example of the method shown in FIGS. 4(A) and 4(B) in which a grinder is used as cutting tool instead of the cutters or the rotating blades. That is, as shown in FIG. 5(A), after the first pressing processing, the first cutting processing is executed in such way that that the grinder 31 cut the protruding part 3a advancing from right to left in regular direction so that the cut surface newly obtained by the cutting is coplanar with the remaining part of the surface of the other side 10b. Then, as shown in FIG. 5(B), in the second cutting processing, after the second pressing processing the grinder 31 cut the protruding part 3 moving right to left in the counter direction so that the cut surface newly obtained by the cutting becomes coplanar with the remaining part of the surface of the other side 10b.

Figure 6:
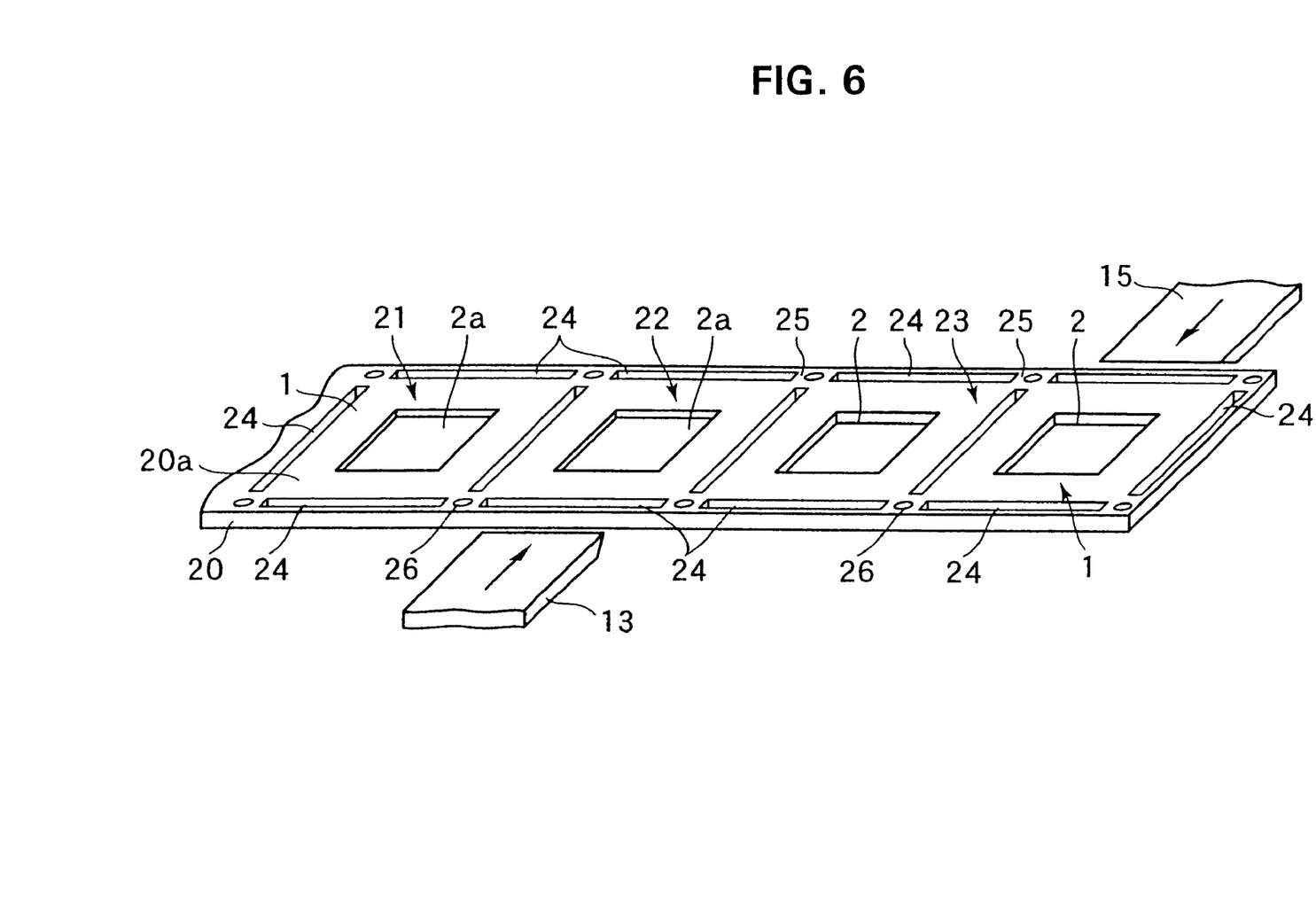
FIG. 6 is a drawing showing a processing procedure of the method for forming the package by means of a transfer-processing machine according to the present invention.

FIG. 6 shows a forming method of a package of electronic parts by means of a transfer-processing machine not shown in the drawing. In this embodiment, a rolled metal band 20 is used as the metal plate, which is, for example, made of cupper alloy, stainless steel and aluminum. First, groove holes 24 defining the outline of the package 1 and pilot holes 26 guiding transfer of the metal band 20 are formed in the metal band. Then, the package 1 and intermediate packages 21 to 23 are formed in such a way that they are connected to each other via connecting portions 25.

After the processing to form the groove holes 24 and pilot holes 26, the first press processing is executed so as to form the intermediate package 21 which has a shallow recess portion 2a in one side surface 20a of the metal band 20 by applying the first pressing processing as shown in FIG. 1(B). Then the intermediate package 21 is transferred for the first cutting processing shown in FIGS. 1(C) and 1(D), where a cutter 13 shaves off the protruding part (not shown in the drawing) formed on the other side surface of the metal band 20 so forming the intermediate package 22. Next, the intermediate package 22 is transferred for the second pressing processing shown by FIG. 1(E) so as to form recess portion 2 having final depth in one side surface 20a of the metal band 20, wherein the intermediate package 23 having a protruding portion on the other side surface of the metal band 20 is formed. After the intermediate package 23 is transferred for a final processing, that is to say the second cutting processing as shown in FIGS. 1(F) and 1(G), the protruding portion (not shown in the drawing) is shaved off by a cutter 15 so that the final shape of the package 1 is formed. Then, before the package 1 is separated from the metal melt 20, semiconductor circuit and wiring board are mounted on the package 1. Finally the package 1 as final product is separated from its intermediates of the metal band by the connecting portions 25.

In the abovementioned method of forming a package of electronic parts by means of a transfer-processing machine each of the steps of first and second pressing processes and cutting processes is executed to only one of the package 1 and its intermediates 21 to 23 in one time. It is applicable that the each of the steps is executed to the plurality of intermediates grouped as one unit for same processing. In this case, the each step of first and second pressing processes and cutting processes is applied to each of the units.

In before mentioned description of embodiments, a semiconductor IC circuit is an example of electronic parts accommodated in the recess portion of the package but another electronic parts for example hybrid circuit, inductor chip or resistor array may adapt as electronic parts. The present invention is not restricted in these embodiments, which may change in an extent without departing from the scope of the invention.

As described above, in package forming method according to the present invention, the protruding portion, which is formed in ledge shape on one surface of the metal plate opposite to the other surface where the recess portion is formed at the same time, is cut bit by bit repeatedly in a plurality of times changing the advancing directions of the cutting means alternately in regular direction and in counter direction. Thus, the stress and its concentration produced by the cutting in regular direction is cancelled or reduced significantly by the cutting in counter direction, and vice versa. As the result, the package of the electronic parts acquires the required evenness and flatness with little warp. Moreover, reduction of the stress and its concentration on the package prevents the time-varying changes of dimensions and evenness of the package. Accordingly, a high accuracy package for electronic parts can be obtained.

What is claimed is:

1. A method for making a package for supporting electronic parts, the package being made from a metal plate, said method comprising steps of:

plastically deforming a part of the metal plate so as to form a recessed portion in a first side surface of the metal plate;

simultaneously forming a first initial protruded portion on a second opposing side surface of the metal plate opposite from the first side surface of the metal plate by displacing a volume of metal corresponding to the recessed portion;

cutting the first initial protruded portion in a regular direction after forming the first initial protruded portion;

plastically deforming a part of the metal plate so as to make the recessed portion deeper in the first side surface of the metal plate;

simultaneously forming a second protruded portion on the second side surface of the metal plate by displacing a volume of metal corresponding to the deeply recessed portion;

cutting the second protruded portion in an opposing counter direction opposite to the regular direction after forming the second protruded portion; and repeatedly executing said plastically deforming step and the cutting step in alternating cutting directions until the recessed portion has a predetermined depth.

2. The method according to claim 1, wherein the number of cuts in the regular direction equals the number of cuts in the counter direction.

3. The method according to claim 1, wherein depth of the recessed portion is less than the thickness of the metal plate and the recessed portion is formed only on the first side surface of the metal plate while the cutting maintains the second side surface flat.

4. The method according to claim 1, wherein a press performs the steps of plastically deforming the metal plate and simultaneously forming the protruded portion.

5. The method according to claim 4 wherein:

the press includes a punch which is shaped to form the recessed portion and to define an outer perimeter for the recessed portion;

the press includes a die on which the metal plate is supported, the die being shaped to define a die recess that is located below the punch, the die recess being shaped to define an outer perimeter of the protruding portion and the die recess being shaped so that the outer perimeter of the protruding portion is smaller in size than the outer perimeter of the recessed portion; and the steps of plastically deforming a part of the metal plate and forming the protruded portion are performed by forcing the punch against the metal plate so the punch forms the recessed portion and causes the protruded portion to form in the die recess.

6. A method for forming a package for receiving electronic parts, the package being made from a metal plate, said method comprising steps of:

plastically deforming a part of a metal plate so as to form a recessed portion in a first side surface of the metal plate;

simultaneously forming a protruding portion on a second side surface of the metal plate opposite from the first side surface of the metal plate by displacing a volume of metal corresponding to the recessed portion; and removing the protruded portion from the metal plate by cutting a part of a thickness of the protruded portion parallel to the second side surface thereof in both a regular direction along the second side surface and in a counter direction that is opposite to the regular direction, the cutting being executed an even number of times.

7. The method according to claim 6, wherein the plastically deforming step for forming the recessed portion in the first side surface of the metal plate and a next plastically deforming step for further plastically deforming the recessed portion to increase depth thereof are executed repeatedly until the recessed portion has a predetermined shape and depth.

8. The method according to claim 6, wherein depth of the recessed portion is less than the thickness of the metal plate and the recessed portion is formed only on the first side surface of the metal plate while the cutting at the second side surface maintains the second side surface flat.

9. The method according to claim 6, wherein the plastically deforming step for forming the recessed portion in the first side surface of the metal plate is performed by a press.

10. The method according to claim 6, wherein:

a press includes a punch which is shaped to form the recessed portion and to define an outer perimeter of the recessed portion;

the press includes a die on which the metal plate is supported, the die being shaped to define a die recess that is located below the punch, the die recess being shaped to define an outer perimeter of the protruding portion and the die recess being shaped so that the outer perimeter of the protruding portion is smaller in size than the outer perimeter of the recessed portion; and the steps of plastically deforming a part of the metal plate and forming the protruded portion are performed by forcing the punch against the metal plate so the punch forms the recessed portion and causes the protruded portion to form in the die recess.

11. A method of making a package for supporting electronic parts comprising the steps of:

placing a flat metal plate in alignment with a punch of a press on a first side surface of the metal plate, the punch being in alignment with a die recess of the press on a second opposing side surface of the metal plate;

deforming a part of the metal plate with the punch of the press, the punch being shaped for forming a recessed portion having a first depth along with a remaining part not effected by the deforming on the first side surface of the metal plate, and forming a first corresponding protruding portion on the second opposing side surface of the metal plate;

removing the first protruding portion in a first regular straight direction after forming the first protruding portion so that the second opposing side surface of the metal plate is coplanar with the remaining part of the first side surface;

repeating deforming of the recessed portion of the first side surface of the metal plate so that the recessed portion has a second depth greater than the first depth and to form a second corresponding protruding portion on the opposing side surface of the metal plate; and removing the second protruding portion on the second opposing side in a second opposing straight direction opposite from the regular straight direction so that the second opposing side surface of the metal plate is coplanar with the remaining part of the first side surface;

wherein the steps of removing the first and second protruding portions in the corresponding first regular straight direction and the second opposing straight direction cancels a concentration of stress and irregular deformation of the metal plate at the second opposing side surface.

12. The method of making a package for supporting electronic parts according to claim 11, wherein the step of removing the first protruding portion comprises cutting the first protruding portion in the first regular straight direction so that the second opposing side surface of the metal plate is coplanar with the remaining part of the first side surface and the step of removing the second protruding portion comprises cutting the second protruding portion in the second opposing straight direction so that the second opposing side surface is coplanar with the remaining part of the first side surface, the regular straight direction and second opposing straight direction being parallel to the second opposing side surface when the second opposing side surface is coplanar with the remaining part of the first side surface.

13. The method of making a package for supporting electronic parts according to claim 12, wherein the cutting steps comprise cutting the first protruding portion and the second protruding portion with an arrow shaped blade.

14. The method of making a package for supporting electronic parts according to claim 11, wherein the step of removing the first protruding portion comprises cutting the first protruding portion with rotating blades of a milling machine traveling along a path in the first regular straight direction so that the second opposing side surface of the metal plate is coplanar with the remaining part of the first side surface and the step of removing the second protruding portion comprises cutting the second protruding portion with rotating blades of a milling machine traveling along the same path in the second opposing straight direction so that the second opposing side surface is coplanar with the remaining part of the first side surface.

15. The method of making a package for supporting electronic parts according to claim 11, wherein the step of removing the first protruding portion comprises removing the first protruding portion with a rotating grinder advancing along a path in the first regular straight direction so that the second opposing side surface of the metal plate is coplanar with a remaining part of the first side surface and the step of removing the second protruding portion comprises removing the second protruding portion with a rotating grinder advancing along the same path in the second opposing straight direction so that the second opposing side surface is coplanar with the remaining part of the first side surface.

16. The method of making a package for supporting electronic parts according to claim 11, including repeating deforming of the recessed portion of the first side surface of the metal plate and removing of the protruding portion on the second opposing side an even number of times greater than two.

17. The method for making a package for supporting electronic parts according to claim 11, wherein the reduced concentration of stress and irregular deformation of the metal plate at the second opposing side surface enables the second opposing side surface to have a warp of no more than 30 nm and the warp of the package is no more than 70 nm.

* * * * *